United States Patent
Kaji et al.

(10) Patent No.: US 12,374,856 B2
(45) Date of Patent: Jul. 29, 2025

(54) SEMICONDUCTOR-LASER-CHIP-ON-SUBMOUNT, MANUFACTURING METHOD THEREOF, AND SEMICONDUCTOR LASER MODULE

(71) Applicant: FURUKAWA ELECTRIC CO., LTD., Tokyo (JP)

(72) Inventors: Eisaku Kaji, Tokyo (JP); Yutaka Ohki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 730 days.

(21) Appl. No.: 17/329,666

(22) Filed: May 25, 2021

(65) Prior Publication Data
US 2021/0281039 A1     Sep. 9, 2021

Related U.S. Application Data

(63) Continuation of application No. PCT/JP2019/045513, filed on Nov. 20, 2019.

(30) Foreign Application Priority Data

Dec. 3, 2018 (JP) ................................. 2018-226840

(51) Int. Cl.
*H01S 5/0237* (2021.01)
*H01S 5/022* (2021.01)
(Continued)

(52) U.S. Cl.
CPC ............ *H01S 5/0237* (2021.01); *H01S 5/022* (2013.01); *H01S 5/023* (2021.01); *H01S 5/0239* (2021.01); *H01S 5/4025* (2013.01)

(58) Field of Classification Search
CPC ....... H01S 5/0237; H01S 5/023; H01S 5/4025
See application file for complete search history.

(56) References Cited

U.S. PATENT DOCUMENTS 8,238,732 B2   8/2012   Kao et al.
2005/0127144 A1   6/2005   Mochida et al.
(Continued)

FOREIGN PATENT DOCUMENTS

CN   101039014 A   9/2007
CN   101272035 A   9/2008
(Continued)

OTHER PUBLICATIONS

Extended European Search Report issued Sep. 15, 2022 in European Patent Application No. 19892074.6, 8 pages.
(Continued)

*Primary Examiner* — Yuanda Zhang
(74) *Attorney, Agent, or Firm* — Oblon, McClelland, Maier & Neustadt, L.L.P.

(57) ABSTRACT

A semiconductor-laser-chip-on-submount includes: a semiconductor laser chip that includes a semiconductor portion having an emitting facet and a rear facet along a longitudinal direction and emits laser light from the emitting facet; and a submount where the semiconductor laser chip is mounted. Further, a first distance between the submount and the emitting facet of the semiconductor portion is less than a second distance between the submount and the rear facet of the semiconductor portion.

10 Claims, 6 Drawing Sheets

(51) Int. Cl.
  *H01S 5/023*  (2021.01)
  *H01S 5/0239* (2021.01)
  *H01S 5/40*   (2006.01)

(56) References Cited

U.S. PATENT DOCUMENTS

| | | | |
|---|---|---|---|
| 2008/0225920 A1* | 9/2008 | Nakashima | H01S 5/0207 438/46 |
| 2008/0291958 A1* | 11/2008 | Kameyama | H01S 5/10 372/43.01 |
| 2017/0117683 A1 | 4/2017 | Junghans et al. | |
| 2020/0067267 A1 | 2/2020 | Takayama et al. | |
| 2021/0296851 A1* | 9/2021 | Hagino | H01S 5/0237 |
| 2023/0011072 A1 | 1/2023 | Miyagoshi et al. | |

FOREIGN PATENT DOCUMENTS

| | | |
|---|---|---|
| CN | 115152107 A | 10/2022 |
| JP | 2007-103542 A | 4/2007 |
| JP | 2007-250739 A | 9/2007 |
| JP | 2009-4760 A | 1/2009 |
| JP | 5075165 B2 | 11/2012 |
| JP | 2017-191899 A | 10/2017 |
| TW | 200940932 A | 10/2009 |
| WO | WO 2018/203466 A1 | 11/2018 |

OTHER PUBLICATIONS

Japanese Office Action issued on Aug. 2, 2022 in Japanese Patent Application No. 2018-226840 (with English translation), 9 pages.
European Office Action issued Apr. 19, 2023 in European Patent Application No. 19 892 074.6, 5 pages.
International Search Report issued Feb. 4, 2020 in PCT/JP2019/045513, filed on Nov. 20, 2019 2 pages.
Taiwanese Office Action issued Feb. 18, 2021 in Taiwanese Application No. 108143126, 13 pages (with Machine generated English translation).
Japanese Office Action issued Feb. 7, 2023 in Japanese Application 2018-226840, (with unedited computer-generated English translation), 10 pages.
Japanese Office Action issued on Jul. 25, 2023 in Japanese Patent Application No. 2018-226840 (with unedited computer-generated English translation), 3 pages.
Combined Chinese Office Action and Search Report issued on Jun. 1, 2023 in Chinese Patent Application No. 201980078728.7 (with unedited computer-generated English translation of Office Action only), 14 pages.

* cited by examiner

SEMICONDUCTOR-LASER-CHIP-ON-SUBMOUNT, MANUFACTURING METHOD THEREOF, AND SEMICONDUCTOR LASER MODULE

CROSS-REFERENCE TO RELATED APPLICATION(S)

This application is a continuation of International Application No. PCT/JP2019/045513, filed on Nov. 20, 2019 which claims the benefit of priority of the prior Japanese Patent Application No. 2018-226840, filed on Dec. 3, 2018, the entire contents of which are incorporated herein by reference.

BACKGROUND

The present disclosure relates to a semiconductor-laser-chip-on-submount, a manufacturing method thereof, and a semiconductor laser module.

Semiconductor laser modules each including a semiconductor laser chip and an optical fiber optically coupled to the semiconductor laser chip have been known. In manufacturing such a semiconductor laser module, assembly is carried out by the following process, for example. Firstly, a semiconductor laser chip is mounted on a submount. In this mounting, the semiconductor laser chip is bonded to the submount with solder, such as gold-tin (AuSn) alloy (see, for example, Japanese Patent No. 5075165). Other adhesive may be used, such as electrically conductive adhesive, instead of solder. A submount having a semiconductor laser chip mounted thereon as described above (a semiconductor-laser-chip-on-submount) is also called a chip-on-submount.

The chip-on-submount is subsequently installed in a metallic housing, directly, or via a metallic base or an electronic cooling element, for example, by bonding with solder, such as tin-bismuth (SnBi) alloy. Other optical components, which may include a lens, are further installed in the housing and the semiconductor laser chip is optically coupled to an optical fiber.

Edge-emitting semiconductor laser chips have been practically used often as semiconductor laser chips. One of facets at both ends of a longitudinal length of an edge-emitting semiconductor laser chip serves as a rear facet having a high reflection (HR) coating formed on the rear facet, the HR coating having high reflectivity at the laser emission wavelength. The other facet, on the other hand, serves as an emitting facet having an anti-reflection (AR) coating formed on the emitting facet, the AR coating having low reflectivity. The rear facet and the emitting facet form a laser resonator and laser light produced by the laser resonator is mainly emitted from the emitting facet.

SUMMARY

There is a need for providing a semiconductor-laser-chip-on-submount, a manufacturing method thereof, and a semiconductor laser module that enable effective heat radiation of heat generated by semiconductor laser chips to submounts.

According to an embodiment, a semiconductor-laser-chip-on-submount includes: a semiconductor laser chip that includes a semiconductor portion having an emitting facet and a rear facet along a longitudinal direction and emits laser light from the emitting facet; and a submount where the semiconductor laser chip is mounted. Further, a first distance between the submount and the emitting facet of the semiconductor portion is less than a second distance between the submount and the rear facet of the semiconductor portion.

DETAILED DESCRIPTION

In the related art, semiconductor laser chips are generally mounted on submounts by die bonding. In die bonding, a semiconductor laser chip is vacuum chucked by a collet, and the semiconductor laser chip is mounted on a submount that has been heated to a temperature equal to or higher than the melting point of the adhesive, such as solder.

Normally, in this die bonding, in general, an area near the center of the semiconductor laser chip in the semiconductor laser chip's longitudinal direction is chucked by the collet and pressed to the submount, such that the semiconductor laser chip is mounted on the submount evenly along the longitudinal direction.

Optical power of semiconductor laser chips is increasingly becoming higher in recent years. Accordingly, effective heat radiation of heat generated by semiconductor laser chips to submounts is becoming increasingly important.

Embodiments of the present disclosure will be described in detail below while reference is made to the appended drawings. The present disclosure is not limited by the embodiments described below. Furthermore, the same reference sign will be assigned to elements that are the same or corresponding to each other, as appropriate, throughout the drawings. In addition, it needs to be noted that the drawings are schematic, and relations among dimensions of elements and ratios among the elements, for example, may be different from the actual ones. What is more, a portion having different dimensional relations and ratios among the drawings may also be included.

Schematic Configuration of Semiconductor Laser Module

Figure 1A:
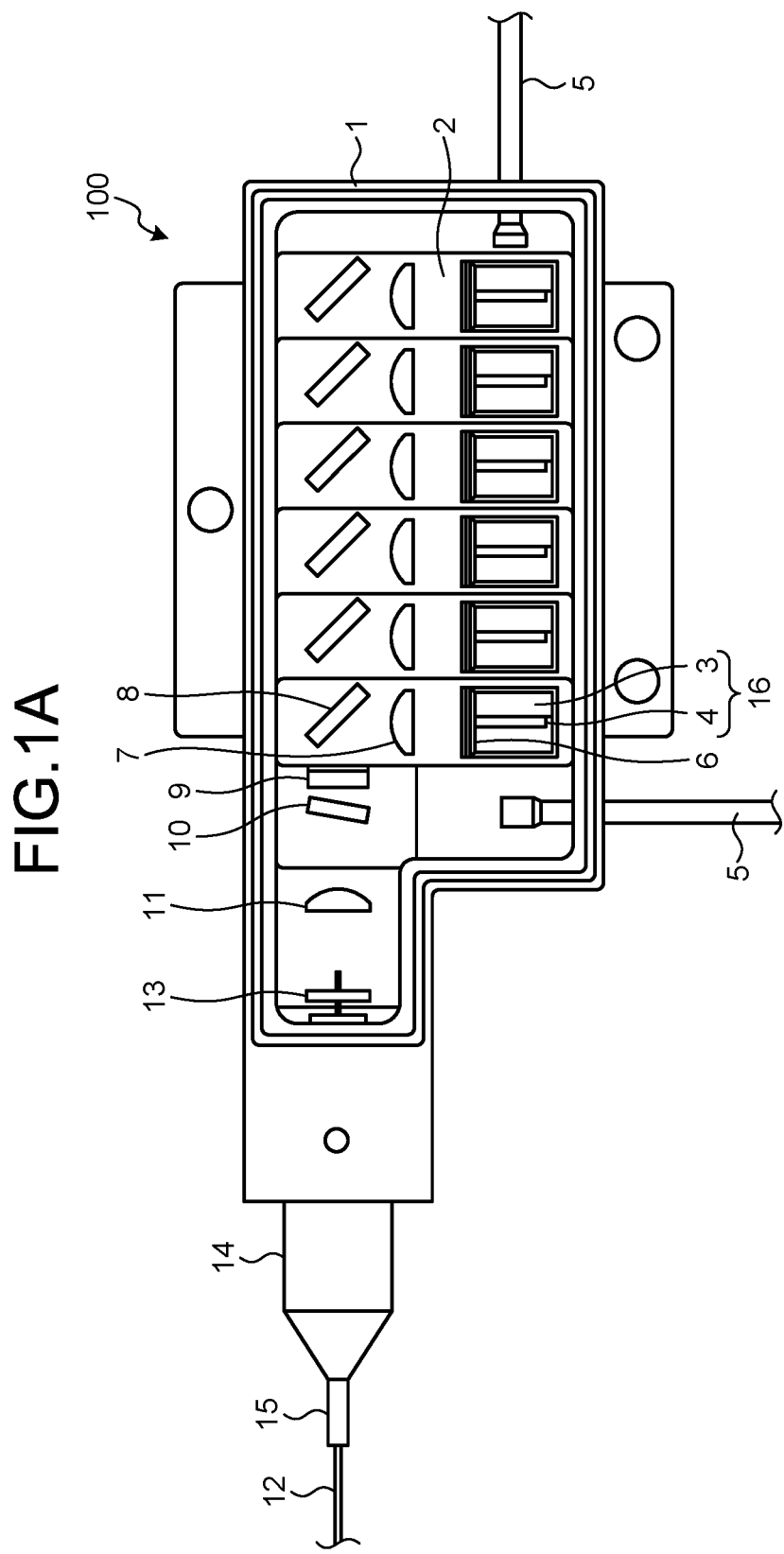
FIG. 1A is a plan view illustrating a schematic configuration of a semiconductor laser module including a chip-on-submount according to an embodiment.
Figure 1B:
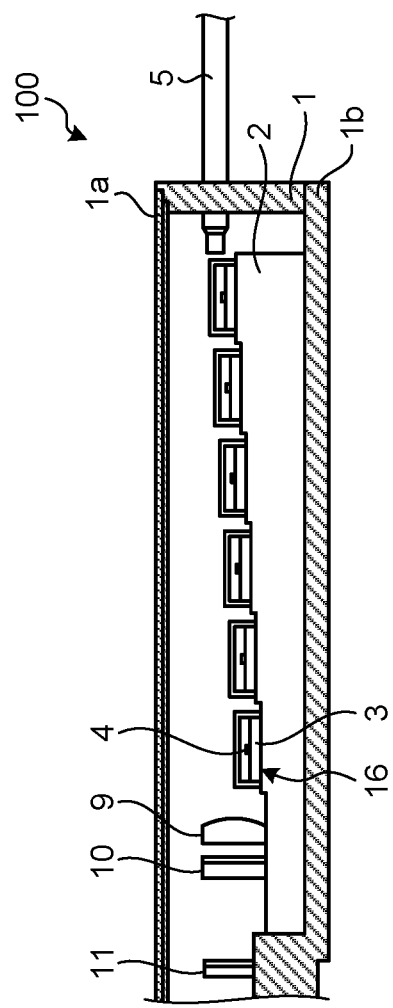
FIG. 1B is a partly notched side view illustrating a schematic configuration of the semiconductor laser module including the chip-on-submount according to the embodiment.

FIG. 1A and FIG. 1B are schematic diagrams illustrating a schematic configuration of a semiconductor laser module including a chip-on-submount according to an embodiment. FIG. 1A is a plan view of the semiconductor laser module, and FIG. 1B is a partly notched side view of the semiconductor laser module.

A semiconductor laser module 100 includes a housing 1 made of metal, the housing 1 having a lid 1a and a bottom plate portion 1b. Furthermore, the semiconductor laser module 100 includes an LD height adjusting plate 2, six submounts 3, and six semiconductor laser chips 4 that are mounted on the bottom plate portion 1b in order, the LD height adjusting plate 2 being made of metal and shaped like stairs, the six submounts 3 each having a rectangular parallelepiped shape, the six semiconductor laser chips 4 each having an approximately rectangular parallelepiped shape. For the purpose of explanation, illustration of the lid 1a has been omitted in FIG. 1A.

Furthermore, the semiconductor laser module 100 includes two lead pins 5. The two lead pins 5 are electrically connected to the semiconductor laser chips 4 via the submounts 3 and bonding wires not illustrated in the drawings, and supply electric power to the semiconductor laser chips 4. The semiconductor laser module 100 also includes six first lenses 6, six second lenses 7, six mirrors 8, a third lens 9, an optical filter 10, and a fourth lens 11. The first lenses 6, the second lenses 7, the mirrors 8, the third lens 9, the optical filter 10, and the fourth lens 11 are arranged in order along and on optical paths of laser light emitted by the respective semiconductor laser chips 4. The semiconductor laser module 100 further includes an optical fiber 12 arranged opposite to the fourth lens 11. An end of the optical fiber 12 is housed inside the housing 1 and is supported by a supporting member 13, the end being where laser light enters the optical fiber 12.

Each of the semiconductor laser chips 4 is made of materials including a main material that is, for example, gallium arsenide (GaAs) or indium phosphide (InP), and outputs laser light having a wavelength according to the materials and composition. Each of the semiconductor laser chips 4 has a thickness of approximately 0.1 mm, for example. The semiconductor laser chips 4 are respectively mounted on the submounts 3, as illustrated in FIG. 1B, and the submounts 3 are mounted on the LD height adjusting plate 2 such that the submounts 3 are at heights different from one another. Furthermore, the first lenses 6, the second lenses 7, and the mirrors 8 are respectively arranged at heights corresponding to their corresponding semiconductor laser chips 4. A structure including the submount 3 and the semiconductor laser chip 4 mounted on the submount 3 will be referred to herein as a chip-on-submount 16 that is a semiconductor-laser-chip-on-submount.

Furthermore, a loose tube 15 is provided at a portion of the optical fiber 12, the portion being where the optical fiber 12 is inserted into the housing 1, and a boot 14 is externally fitted to a part of the housing 1 so as to cover a part of the loose tube 15 and the portion.

Operation of the semiconductor laser module 100 will be described below. The semiconductor laser chips 4 receive electric power supplied via the lead pins 5 and output laser light. Laser light output from the semiconductor laser chips 4 is formed into approximately collimated light by the corresponding first lenses 6 and second lenses 7 and the approximately collimated light is reflected by the corresponding mirrors 8 to the third lens 9. The laser light is then condensed by the third lens 9 and the fourth lens 11, enters the optical fiber 12 from an end face of the optical fiber 12, and propagates through the optical fiber 12. The optical filter 10 is a bandpass filter for preventing light having a wavelength different from the wavelength of the laser light from entering the semiconductor laser chips 4 when the light is input to the semiconductor laser module 100 via the optical fiber 12 from outside.

Assembly of the semiconductor laser module 100 is carried out by the following process, for example. Firstly, the submounts 3 are heated to approximately 300° C. that is a junction temperature, the semiconductor laser chips 4 are mounted on the submounts 3 by bonding with AuSn solder having a melting point of approximately 280° C., and six chip-on-submounts 16 are thereby formed. Subsequently, the bottom plate portion 1b of the housing 1 having the LD height adjusting plate 2 installed therein is heated to approximately 150° C. that is a junction temperature, and each of the chip-on-submounts 16 is mounted on the LD height adjusting plate 2 by bonding with SnBi solder having a melting point of approximately 140° C. Thereafter, other components of the semiconductor laser module 100 are installed in the housing 1.

Schematic Configuration of Chip-on-Submount

Figure 2:
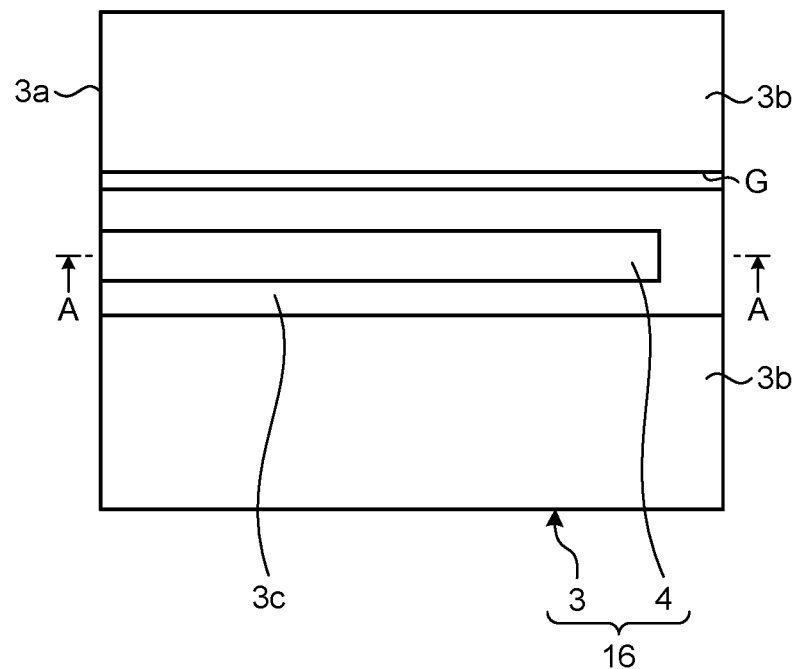
FIG. 2 is a schematic plan view of the chip-on-submount illustrated in FIG. 1A and FIG. 1B.

The chip-on-submounts 16 will be described next. FIG. 2 is a schematic plan view of one of the chip-on-submounts 16. As described above, the chip-on-submount 16 includes the semiconductor laser chip 4, and the submount 3 where the semiconductor laser chip 4 is mounted.

The submount 3 includes a substrate 3a and an upper covering layer 3b. The substrate 3a may be formed to include, for example, at least one selected from the group of: aluminum nitride (AlN); alumina ($Al_2O_3$); beryllia (BeO); boron nitride (BN); diamond, silicon carbide (SiC); silicon nitride ($Si_3N_4$); silicon dioxide ($SiO_2$); and zirconia ($ZrO_2$). In this embodiment, the semiconductor laser chip 4 is of the single emitter type, but the semiconductor laser chip 4 may be a multi-emitter laser bar chip. If the semiconductor laser chip 4 is formed as a laser bar chip, the substrate 3a may be made of metal, such as Cu. In this embodiment, the substrate 3a is made of AlN. Furthermore, the substrate 3a has a thickness of approximately 0.3 mm to 1.0 mm, for example.

The upper covering layer 3b has a thickness in a range of 1 μm to 80 μm, for example, and is formed on a surface of the substrate 3a, the surface being where the semiconductor laser chip 4 is mounted. The upper covering layer 3b is formed of a metallic multilayer coating.

The upper covering layer 3b is separated into two portions by a groove G. The groove G is provided to electrically insulate the two portions from each other. One of the two portions of the upper covering layer 3b is electrically connected to an upper surface of the semiconductor laser chip 4 by a bonding wire not illustrated in the drawings, and the semiconductor laser chip 4 is mounted on the other one of the two portions of the upper covering layer 3b.

The semiconductor laser chip 4 is mounted on the submount 3 by bonding, with the upper covering layer 3b interposed between the semiconductor laser chip 4 and the submount 3. A precoat 3c formed of, for example, AuSn solder, is formed on a surface of the upper covering layer 3b, and this precoat 3c enables the semiconductor laser chip 4 to be mounted on the upper covering layer 3b by bonding. A barrier metal layer made of, for example, platinum (Pt), may preferably be formed on a surface of the upper covering layer 3b, the surface being a surface that comes into contact with the precoat 3c. The barrier metal layer is formed to prevent a chemical reaction between the AuSn solder of the precoat 3c and a metallic material located lower than the barrier metal layer on the upper covering layer 3b.

Electrodes are respectively formed on a bottom surface (a surface to be bonded to the upper covering layer 3b) and the upper surface of the semiconductor laser chip 4 and electric power is supplied to the semiconductor laser chip 4 from the lead pins 5 via these electrodes. If the semiconductor laser chip 4 is mounted with the junction down, an n-side electrode is generally formed on the upper surface of the semiconductor laser chip 4. Furthermore, if the semiconductor laser chip 4 is mounted with the junction up, a p-side electrode is generally formed on the upper surface of the semiconductor laser chip 4. More heat is radiated to the submount 3 when the semiconductor laser chip 4 is mounted with the junction down.

Figure 3:
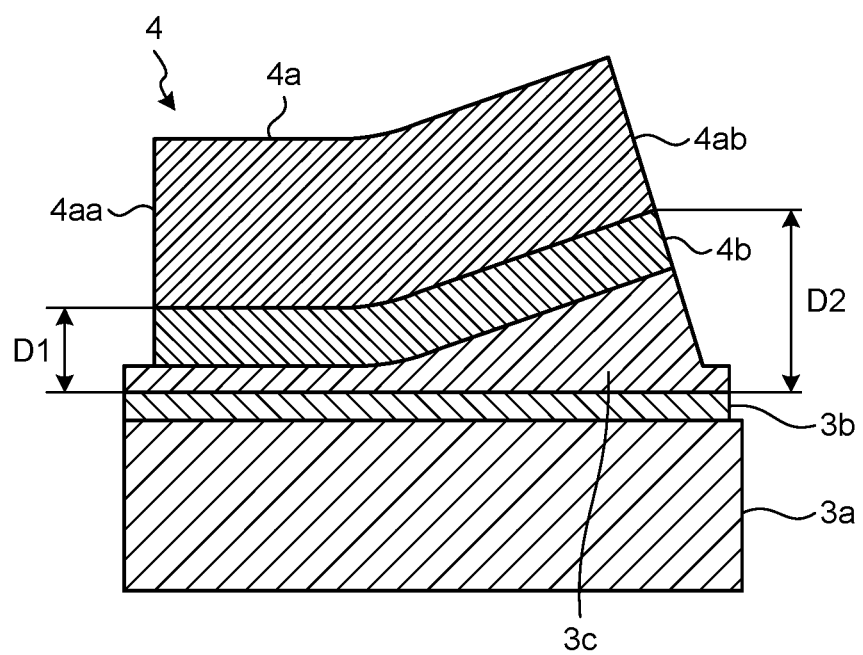
FIG. 3 is a diagram illustrating a part of an A-A line section of the chip-on-submount illustrated in FIG. 2.

FIG. 3 is a diagram illustrating a part of an A-A line section of the chip-on-submount 16. As illustrated in FIG. 3, the semiconductor laser chip 4 includes: a semiconductor portion 4a made mainly of a semiconductor; and a metallized layer 4b made mainly of metal. The semiconductor portion 4a has an emitting facet 4aa and a rear facet 4ab at points along a longitudinal direction thereof, and emits laser light from the emitting facet 4aa. An AR coating having reflectivity of approximately 0.1% to 7% at a laser emission wavelength, for example, is formed on the emitting facet 4aa. An HR coating having reflectivity of approximately 95% at the laser emission wavelength, for example, is formed on the rear facet 4ab. The emitting facet 4aa and the rear facet 4ab form a laser resonator and a distance between the emitting facet 4aa and the rear facet 4ab is a cavity length. The cavity length is, for example, approximately 800 μm to 6 mm, but is not particularly limited. Furthermore, a width of the semiconductor laser chip 4 is, for example, 100 μm to 1 mm, but is not particularly limited.

Furthermore, the semiconductor portion 4a is formed on, for example, a GaAs substrate and forms a single-mode or multi-mode waveguide. An active layer has a composition set to achieve a laser emission wavelength from 900 nm to 1080 nm, for example. The power of laser light emitted from the emitting facet 4aa is, for example, 10 mW to 30 W, but is not particularly limited. In addition, in this embodiment, the semiconductor laser chip 4 is of the single emitter type, but the semiconductor laser chip 4 may be a multi-emitter laser bar chip.

The metallized layer 4b has a multilayer structure including, for example, an electrode for supplying electric power to the semiconductor laser chip 4, and a plated layer for protecting the electrode. The metallized layer 4b has a thickness of, for example, 1 μm to 10 μm.

Thickness of the AuSn solder of the precoat 3c is not particularly limited, as long as the AuSn solder has a thickness enabling the metallized layer 4b and the upper covering layer 3b to be bonded to each other sufficiently and providing desired values for later described distances between the submount 3 and predetermined portions of the semiconductor portion 4a.

A distance (a first distance) between the submount 3 and the semiconductor portion 4a at the emitting facet 4aa will be referred to as D1 and a distance (a second distance) between the submount 3 and the semiconductor portion 4a at the rear facet 4ab will be referred to as D2. D1 is typically a distance between the submount 3 and the emitting facet 4aa of the semiconductor portion 4a. However, D1 may be a distance between the submount 3 and an area of a width within 20 μm from the emitting facet 4aa toward the semiconductor portion 4a's center in the longitudinal direction. Similarly, D2 is typically a distance between the submount 3 and the rear facet 4ab of the semiconductor portion 4a. However, D2 may be a distance between the submount 3 and an area of a width within 20 μm from the rear facet 4ab toward the semiconductor portion 4a's center in the longitudinal direction.

In this chip-on-submount 16, D1 is less than D2, and heat generated by the semiconductor laser chip 4 is thus able to be effectively radiated to the submount 3.

Specific description will be made below. According to the inventors' careful examination of properties of semiconductor laser chips, the higher the optical power of the semiconductor laser chip 4 is, the larger the difference in power between the emitting facet 4aa and rear facet 4ab of the semiconductor portion 4a becomes. Specifically, the power is larger at the emitting facet 4aa. Accordingly, the amount of heat locally generated at the emitting facet 4aa is larger.

Inventors of the present disclosure then thought of making D1 less than D2. By doing this, the emitting facet 4aa becomes closer to the submount 3 than the rear facet 4ab is, and heat generated at the emitting facet 4aa is thus preferentially and effectively radiated to the submount 3. As a result, since heat generated by the semiconductor laser chip 4 is able to be radiated effectively to the submount 3, the light emission efficiency is improved and the optical power is increased. Furthermore, the emitting facet 4aa that tends to become high in temperature more is able to be decreased in temperature effectively, and reliability of the semiconductor laser chip 4 is thus able to be improved and the failure rate is thus able to be reduced, for example.

By carrying out various experiments, the inventors confirmed that making the difference between D1 and D2 equal to or larger than 1.5 μm significantly reduced the failure rate of the semiconductor laser chip 4. However, when the difference between D1 and D2 is too large, heat radiation at the rear facet 4ab may be significantly reduced or the bonding of the solder of the precoat 3c at the rear facet 4ab may be deteriorated, and the difference between D1 and D2 is thus preferably made equal to or smaller than 10 μm. For example, in experiments carried out with high-power semiconductor laser chips that inject electric current of 10 A to 20 A per chip, when the difference between D1 and D2 was larger than 10 μm, severe failures where the semiconductor laser chips melt upon passage of electric current were observed. Furthermore, D1 is preferably 16 μm or less, or more preferably 12 μm or less, so that the emitting facet 4aa becomes comparatively close to the submount 3.

Furthermore, although the semiconductor laser chip 4 in this embodiment has a slight warp so as to be convex toward the metallized layer 4b, as illustrated in FIG. 3, it is evident that even if the semiconductor laser chip 4 is linear without a warp, the effect of enabling effective heat radiation to the submount 3 is able to be obtained.

Manufacturing Method for Chip-on-Submount

Next, an example of a manufacturing method for the chip-on-submount 16 will be described in comparison with a reference example.

This manufacturing method include a process of mounting the semiconductor laser chip 4 on the submount 3 by pressing an area of the semiconductor laser chip 4 to the submount 3 by using a collet serving as a holding tool, the area being nearer to the emitting facet 4aa than the semiconductor laser chip 4's center in the longitudinal direction.

Figure 4A:
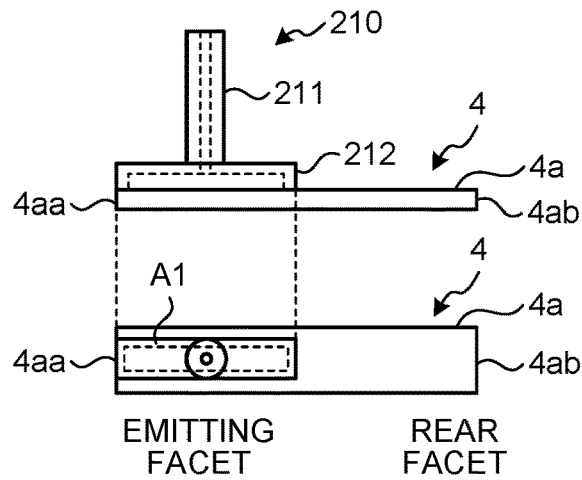
FIG. 4A is an explanatory diagram for a chucked state of a semiconductor laser chip in a manufacturing method of the embodiment.
Figure 4B:
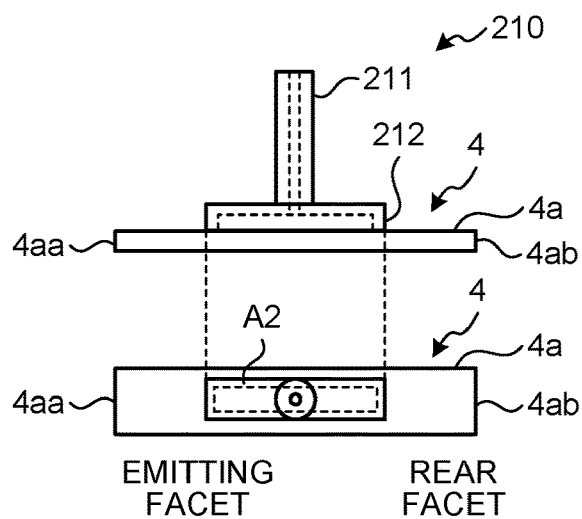
FIG. 4B is an explanatory diagram for a chucked state of the semiconductor laser chip in a manufacturing method of a reference example.

FIG. 4A is an explanatory diagram for a chucked state of the semiconductor laser chip 4 in the manufacturing method of the embodiment, and FIG. 4B is an explanatory diagram of a chucked state of the semiconductor laser chip 4 in a manufacturing method of a reference example. FIG. 4A and FIG. 4B each illustrate a case where the chucked semiconductor laser chip 4 is viewed from the side and a case where that chucked semiconductor laser chip 4 is viewed from the top. A collet 210 is, for example, a flat collet having a main body 211 made of metal and a distal end portion 212 made of polyimide resin, the distal end portion 212 having a rectangular parallelepiped shape. The collet 210 has, formed therein, a vacuum hole open on a distal end surface of the distal end portion 212 and joined to a vacuum pump. The collet 210 is capable of holding the semiconductor laser chip 4 at the distal end portion 212 by vacuum chucking the semiconductor laser chip 4 by suction through the vacuum hole.

In the reference example, chucking is done by the distal end portion 212 of the collet 210 being brought into contact with an area of the semiconductor laser chip 4, such that the semiconductor laser chip 4 is mounted on the submount 3 evenly along the longitudinal direction, the area being near the semiconductor laser chip 4's center in the longitudinal direction. An area A2 is the area over which the distal end portion 212 contacts the semiconductor laser chip 4.

In contrast, in the present manufacturing method, chucking is done by the distal end portion 212 of the collet 210 being brought into contact with an area of the semiconductor laser chip 4, the area having the area's center nearer to the emitting facet 4aa than the semiconductor laser chip 4's center is in the longitudinal direction. An area A1 is the area over which the distal end portion 212 contacts the semiconductor laser chip 4.

Although FIG. 4A and FIG. 4B each illustrate a state where the emitting facet 4aa and an end portion of the distal end portion 212 of the collet 210 are aligned with each other, the end portion being near the emitting facet in the longitudinal direction, as long as suction is possible, the end portion of the distal end portion 212 of the collet 210 may jut out from the emitting facet 4aa of the semiconductor laser chip 4, the end portion being near the emitting facet in the longitudinal direction. Or, if the distance D1 at the emitting facet 4aa is sufficiently narrow, the end portion of the distal end portion 212 of the collet 210 may be retracted toward the center of the semiconductor laser chip 4 in the longitudinal direction, the end portion being near the emitting facet 4aa in the longitudinal direction. However, the closer the center of the distal end portion 212 of the collet 210 is to the center of the semiconductor laser chip 4 in the longitudinal direction, the smaller the effect of narrowing the distance D1 becomes.

Figure 5:
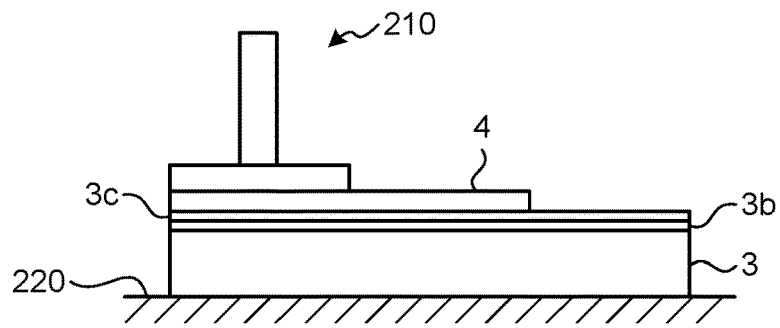
FIG. 5 is an explanatory diagram for mounting of the semiconductor laser chip.

As illustrated in FIG. 5, the semiconductor laser chip 4 is mounted on the submount 3 by being pressed to the submount 3 by use of the collet 210, the submount 3 having been placed on a pedestal 220 and having been heated by a heater not illustrated in the drawings such that the precoat 3c is melted. The chip-on-submount 16 having D1 smaller than D2 as illustrated in FIG. 3 is thereby able to be manufactured.

The process of mounting the semiconductor laser chip 4 on the submount 3 by bonding may include a process of temporarily separating the collet 210 from the semiconductor laser chip 4. This is intended to prevent heat coming from the heater, from radiating via the collet 210 and to more effectively melt the solder. In this case also, as long as an area nearer to the emitting facet 4aa than the center of the semiconductor laser chip 4 is in the longitudinal direction is pressed in any process in which the collet 210 presses the semiconductor laser chip 4, effects of the present disclosure are achieved.

Figure 6:
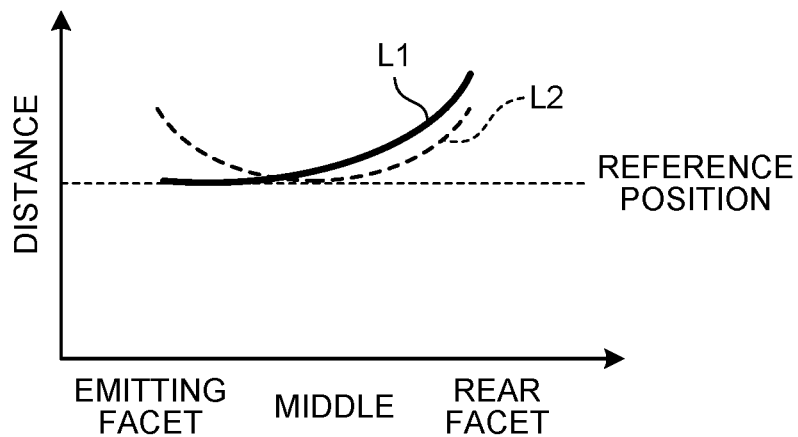
FIG. 6 is an explanatory diagram for mounted states of the semiconductor laser chip.

FIG. 6 is an explanatory diagram for mounted states of the semiconductor laser chip 4. The horizontal axis represents the longitudinal direction of the semiconductor laser chip 4, and the vertical axis represents distance between the submount 3 and the semiconductor portion 4a. The reference position therein represents the lowest position of a bottom surface of the semiconductor portion 4a in the mounted states. A line L1 represents the mounted state of the semiconductor laser chip 4 by the present manufacturing method and a line L2 represents the mounted state of the semiconductor laser chip 4 in the reference example. As illustrated therein, according to the line L1 representing the present manufacturing method, the distance between the submount 3 and the semiconductor portion 4a at the emitting facet 4aa is able to be made smaller than that indicated by the line L2 representing the reference example, and the chip-on-submount 16 enabling effective heat radiation is thus able to be manufactured.

First Example and First Comparative Example

A submount having an upper covering layer and a precoat 3c formed on a substrate made of AlN was prepared, the upper covering layer including a barrier metal layer made of Pt and being formed of a metallic multilayer coating having Cu as a main component, the precoat 3c being formed of AuSn solder. Furthermore, a semiconductor laser chip was prepared, the semiconductor laser chip having: an active layer formed on a GaAs substrate and including InGaAs; a cavity length of 4.5 mm; and a thickness of approximately 0.1 mm. The semiconductor laser chip was chucked by using a flat collet, mounted on the submount, and a chip-on-submount was thereby fabricated. The flat collet had a collet length of 2 mm. This collet length is a distance between both ends of the collet in the collet's longitudinal direction, the ends being those that come in contact with the semiconductor laser chip in a state where the collet is holding the semiconductor laser chip. Therefore, even if there is a part where the semiconductor laser chip and the collet are not in contact with each other between the collet's ends that come into contact with the semiconductor laser chip, the existence of that non-contacting part does not change the collet length.

In a first example, as illustrated in FIG. 4A, by aligning an end portion of the collet, the end portion being near an emitting facet of the semiconductor laser chip, approximately with the emitting facet, the collet was brought into contact with an area of the semiconductor laser chip, the area having the area's center nearer to the emitting facet than the center of the semiconductor laser chip is in the longitudinal direction, and chucking was carried out. In contrast, in a first comparative example, as illustrated in FIG. 4B, the collet was brought into contact with an area of the semiconductor laser chip, the area being near the center of the semiconductor laser chip in the longitudinal direction, and chucking was carried out.

After mounting, distances between the semiconductor portion and the submount were measured for: a position at the center of the semiconductor portion in the longitudinal direction; an area of a width within 20 μm from the emitting facet toward the center of the semiconductor portion in the longitudinal direction; and an area of a width within 20 μm from the rear facet toward the center of the semiconductor portion in the longitudinal direction.

Figure 7A:
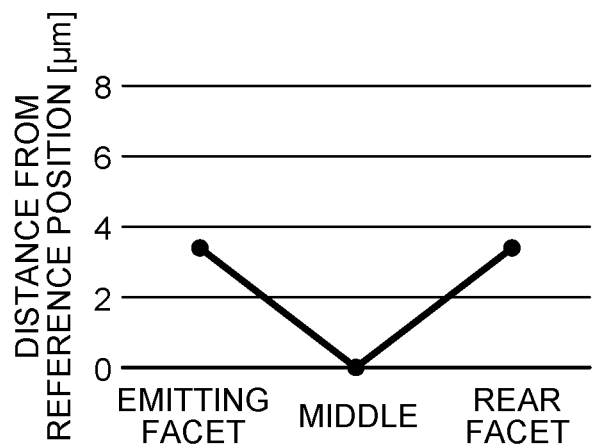
FIG. 7A is an explanatory diagram for a mounted state of a semiconductor laser chip in a first comparative example.
Figure 7B:
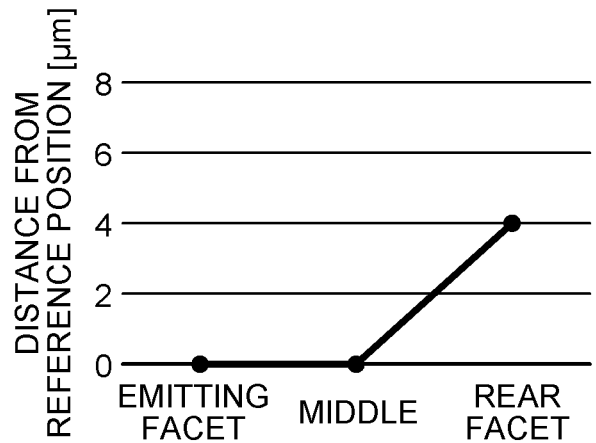
FIG. 7B is an explanatory diagram for a mounted state of a semiconductor laser chip in a first example.

FIG. 7A is an explanatory diagram for a mounted state of the semiconductor laser chip in the first comparative example, and FIG. 7B is an explanatory diagram for a mounted state of the semiconductor laser chip in the first example. FIG. 7A and FIG. 7B illustrate distances at the emitting facets and rear facets, with the center positions being reference positions. In the first comparative example, the distances are approximately the same at the emitting facet and rear facet. In contrast, in the first example, the distance at the emitting facet was able to be made closer to the submount by approximately 4 μm than the distance at the rear facet was.

Subsequently, 24 pairs of submounts and semiconductor laser chips similar to those used in the first example and first comparative example were prepared, the semiconductor laser chips were mounted on the submounts, and 42 samples of chip-on-submounts were thereby fabricated. For sample numbers 1 to 18, the semiconductor laser chips were chucked near the center of the semiconductor laser chips in the longitudinal direction, similarly to the first comparative example; and for sample numbers 19 to 42, the semiconductor laser chips were chucked at areas around the emitting facets, similarly to the first example.

Figure 8:
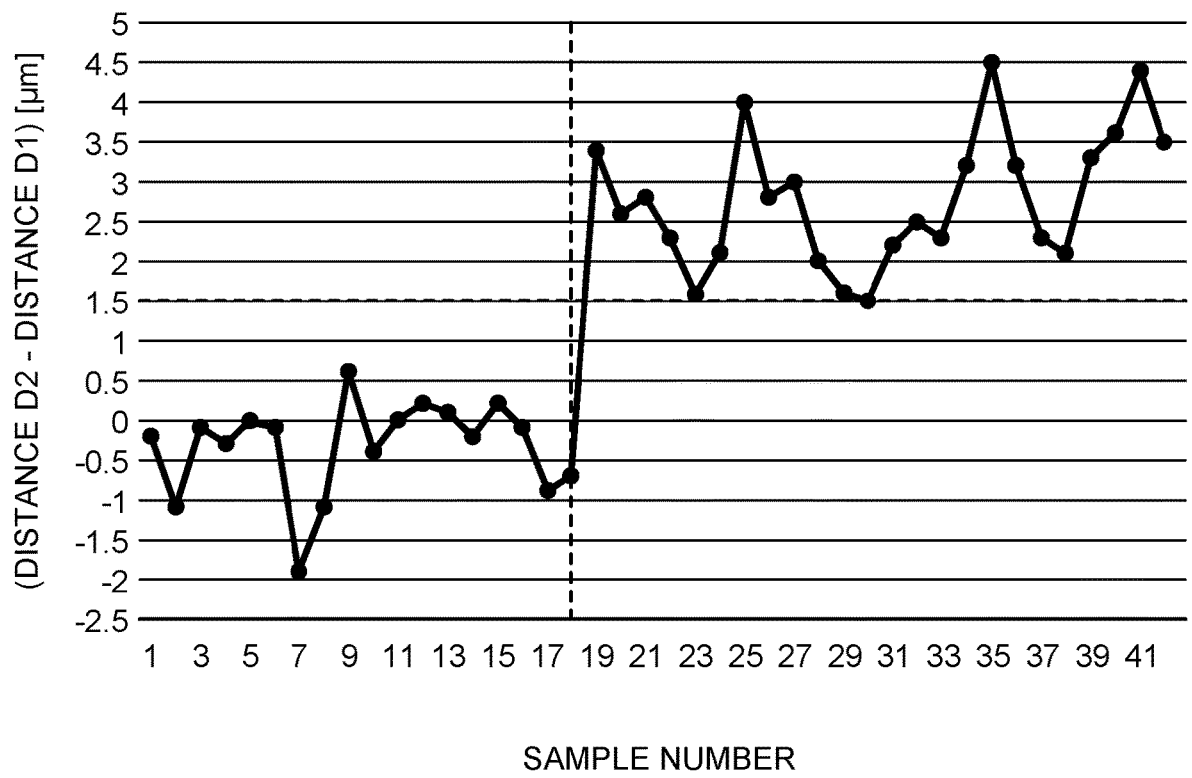
FIG. 8 is an explanatory diagram for mounted states of plural samples of chip-on-submounts.

FIG. 8 is an explanatory diagram of mounted states of the plural samples of chip-on-submounts, and illustrates a difference (distance D2–distance D1) between D2 and D1 measured for each sample. As illustrated in FIG. 8, for the sample numbers 1 to 18, the value of (distance D2–distance D1) was around 0 μm. A mean value of (distance D2–distance D1) for the sample numbers 1 to 18 was −0.3 μm, the maximum value was 0.6 μm, and the minimum value was −1.9 μm. In contrast, for the sample numbers 19 to 42, the value of (distance D2–distance D1) was 1.5 μm or larger. A mean value of (distance D2–distance D1) for the sample numbers 19 to 42 was 2.8 μm, the maximum value was 4.5 μm, and the minimum value was 1.5 μm. Therefore, the method in the first example enables (distance D2–distance D1) to be 1.5 μm or more.

Subsequently, the maximum standard value of supplied electric current was supplied to the semiconductor laser chips on the chip-on-submounts fabricated in the first example and first comparative example and their maximum optical power was measured. In this measurement, electric current was passed therethrough, with the chip-on-submounts placed on a stage having its temperatures adjusted to 30° C.

Figure 9:
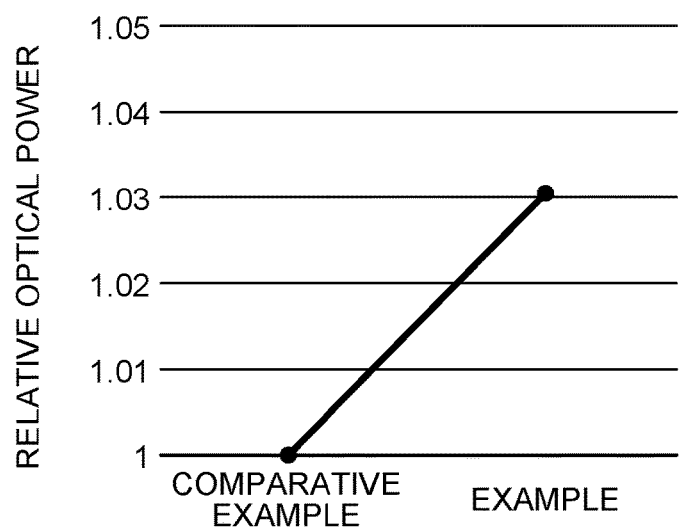
FIG. 9 is an explanatory diagram for relative optical power of semiconductor laser chips in the first example and the first comparative example.

FIG. 9 is an explanatory diagram for relative optical power of the semiconductor laser chips in the first example and the first comparative example. FIG. 9 illustrates the relative optical power in a case where the maximum optical power in the first comparative example is assumed to be 1. As illustrated in FIG. 9, in the first example, the maximum optical power was confirmed to increase from that in the first comparative example by 38 or more.

Subsequently, in second to sixth examples, flat collets and a round collet having a distal end portion with an approximately circular distal end surface were prepared, semiconductor laser chips were mounted on submounts by using these collets, and 100 or more chip-on-submounts were thereby fabricated for these examples. The semiconductor laser chips prepared included those with a cavity length of 4.5 mm similarly to the first example and those with a shorter cavity length of 4 mm. Furthermore, the collets prepared had collet lengths of 0.5 mm, 2 mm, 3 mm, and 4 mm. In addition, in the second to sixth examples, similarly to the first example, contacting and chucking were carried out so that end portions of the collets at the emitting facets were aligned approximately with emitting facets of the semiconductor laser chips.

Table 1 has, listed therein, for the second to sixth examples, cavity lengths, collet lengths, ratios, wettability, failure rates, and collet types. The ratio means a ratio of a collet length to the cavity length. Since longitudinal directions are unable to be specified for round collets, the collet lengths were determined along the longitudinal direction of the semiconductor laser chips. Furthermore, the wettability indicates whether the solder has been spread over evenly between the semiconductor laser chip and the submount, and was evaluated visually. The failure rate was evaluated by long-term electric current tests of the chip-on-submounts and tests in which large injection currents were used for the chip-on-submounts. For the wettability and failure rates, the word "good" means that the property was satisfactory, and the word "fair" indicates that the property was not as satisfactory as that labeled as "good", but was in a practically acceptable range depending on conditions.

TABLE 1

| Example | Cavity length [mm] | Collet length [mm] | Ratio [%] | Wettability | Failure rate | Collet type |
|---|---|---|---|---|---|---|
| 2 | 4.5 | 0.5 | 11.1 | Good | Fair | Round |
| 3 | 4 | 0.5 | 12.5 | Good | Fair | Round |
| 4 | 4.5 | 2 | 44.4 | Good | Good | Flat |
| 5 | 4 | 3 | 75.0 | Good | Good | Flat |
| 6 | 4.5 | 4 | 88.9 | Fair | Good | Flat |

From the results listed in Table 1, it has been confirmed that the ratio of the collet length to the cavity length is preferably 28.5% or more and 81.9% or less in terms of the wettability and failure rate, and more preferably 44.4% or more and 75.0% or less. The ratio 28.5% is a mean value of the third and fourth examples, and 81.9% is a mean value of the fifth and sixth examples. The failure rate or wettability of the third and six examples may be acceptable depending on the optical power to be used or the reliability to be warranted, and their ratios between the cavity lengths and collect lengths were thus used in calculating the mean values.

It is considered that in the second and third examples, because the ratios were small, the collets were unable to press the semiconductor laser chips at the rear facets, and (distance D2–distance D1) thus became large and the heat radiation at the rear facet was thus reduced. In the second and third examples, in cases where the difference between D1 and D2 was larger than 10 μm, severe failures were observed when injection currents were increased, the severe failures including melting of the semiconductor laser chips. As a result of analysis of the test results for the second to sixth examples, an extracted population of chip-on-submounts each having the distance D1 larger than 16 μm was found to have higher failure rates in the long-term electric current tests than a population of chip-on-submounts each having the distance D1 of 16 μm or less. When the distance D1 was 12 μm or less, the failure rates were found to be even lower. In the fourth and fifth examples, ideal manufacturing was found to be possible, such that 98% or more of the chip-on-submounts had the distance D1 of 12 μm or less. Furthermore, the wettability was somewhat low in the six example. This is considered to be because the ratio was large and the collet was thus large, it became easier for heat to radiate from the heated submount via the collet, and the temperature of the solder was thus decreased.

The present disclosure is not limited by the above described embodiments. The present disclosure also includes those formed by combination of any of the above described components of the embodiments as appropriate.

Furthermore, further effects and modifications can be easily derived by those skilled in the art. Therefore, wider aspects of the present disclosure are not limited to the above described embodiments, and various modifications are possible.

INDUSTRIAL APPLICABILITY

The present disclosure may be utilized for semiconductor-laser-chip-on-submounts, manufacturing methods thereof, and semiconductor laser modules.

The present disclosure has an effect of enabling effective heat radiation of heat generated by semiconductor laser chips to the submount.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. A semiconductor-laser-chip-on-submount, comprising:
a semiconductor laser chip that includes a semiconductor portion having an emitting facet and a rear facet along a longitudinal direction and emits laser light from the emitting facet; and
a submount where the semiconductor laser chip is mounted via a precoat with a junction down, the precoat being made of solder and being configured to radiate heat generated at the semiconductor laser chip to the submount, wherein
a thickness of the precoat at the emitting facet differs from a thickness of the precoat at the rear facet such that a first distance between a top surface of the submount and a bottom surface of the semiconductor portion at the emitting facet is less than a second distance between the top surface of the submount and the bottom surface of the semiconductor portion at the rear facet, the top surface of the submount being on a side of the semiconductor laser chip,
power of the laser light from the emitting facet is greater than power of the laser light from the rear facet,
an amount of heat generated at the emitting facet is greater than an amount of heat generated at the rear facet,
in the junction down to radiate heat generated at the semiconductor laser chip to the submount, the semiconductor portion at the emitting facet is closer to the submount than the semiconductor portion at the rear facet so as to radiate the heat generated at the emitting facet to the submount more effectively than the heat generated at the rear facet,
the semiconductor laser chip is configured such that heat generated at the semiconductor laser chip is radiated to the submount with the precoat,
the semiconductor laser chip is configured such that more heat is radiated to the submount than when the semiconductor laser chip is mounted with a junction up, and
a difference between the first distance and the second distance is 10 µm or less.

2. The semiconductor-laser-chip-on-submount according to claim 1, wherein the difference between the first distance and the second distance is 1.5 µm or more.

3. The semiconductor-laser-chip-on-submount according to claim 1, wherein the first distance is 16 µm or less.

4. The semiconductor-laser-chip-on-submount according to claim 1, wherein the first distance is 12 µm or less.

5. The semiconductor-laser-chip-on-submount according to claim 1, wherein the semiconductor laser chip is a laser bar chip.

6. A manufacturing method for the semiconductor-laser-chip-on-submount according to claim 1, the manufacturing method comprising:
a process of mounting the semiconductor laser chip on the submount by pressing an area of the semiconductor laser chip to the submount by using a holding tool, the area having the area's center nearer to the emitting facet than the semiconductor laser chip's center along the longitudinal direction.

7. The manufacturing method for the semiconductor-laser-chip-on-submount according to claim 6, wherein
the holding tool is a collet, and
a ratio of a collet length along a longitudinal direction of the collet to a cavity length is 28.5% or more and 81.9% or less, the collet length being a distance between both ends of the collet, the both ends being ends that come in contact with the semiconductor laser chip, the cavity length being a distance between the emitting facet and rear facet of the semiconductor laser chip.

8. The manufacturing method for the semiconductor-laser-chip-on-submount according to claim 7, wherein the ratio of the collet length to the cavity length is 44.4% or more and 75.0% or less.

9. The manufacturing method for the semiconductor-laser-chip-on-submount according to claim 6, wherein the semiconductor laser chip is a laser bar chip.

10. A semiconductor laser module comprising the semiconductor-laser-chip-on-submount according to claim 1.

* * * * *